US010069514B2

(12) United States Patent
Zhu et al.

(10) Patent No.: US 10,069,514 B2
(45) Date of Patent: Sep. 4, 2018

(54) LOW-POWER LOW DENSITY PARITY CHECK DECODING (71) Applicant: MaxLinear, Inc., Carlsbad, CA (US)

(72) Inventors: Mingrui Zhu, Irvine, CA (US); Curtis Ling, Carlsbad, CA (US); Timothy Gallagher, Encinitas, CA (US)

(73) Assignee: MAXLINEAR, INC., Carlsbad, CA (US)

( * ) Notice: Subject to any disclaimer, the term of this patent is extended or adjusted under 35 U.S.C. 154(b) by 0 days.

(21) Appl. No.: 15/832,030

(22) Filed: Dec. 5, 2017

(65) Prior Publication Data

US 2018/0159554 A1 Jun. 7, 2018

Related U.S. Application Data (63) Continuation of application No. 15/358,473, filed on Nov. 22, 2016, now Pat. No. 9,838,035, which is a (Continued)

(51) Int. Cl.
*H03M 13/11* (2006.01)
*H03M 13/00* (2006.01)
*H04L 1/00* (2006.01)

(52) U.S. Cl.
CPC ...... *H03M 13/1114* (2013.01); *H03M 13/114* (2013.01); *H03M 13/1111* (2013.01);
(Continued)

(58) Field of Classification Search
CPC .......... H03M 13/1128; H03M 13/1111; H03M 13/1131; H03M 13/1114; H03M 13/1125;
(Continued)

(56) References Cited

U.S. PATENT DOCUMENTS

2003/0229843 A1 12/2003 Yu et al.
2005/0204272 A1 9/2005 Yamagishi
(Continued)

OTHER PUBLICATIONS

Darabiha, A. et al., Power Reduction Techniques for LDPC Decoders, IEEE Journ. of Solid-State Circuits, vol. 43, No. 8, Aug. 2008, pp. 1835-1945.
(Continued)

*Primary Examiner* — John J Tabone, Jr.
(74) *Attorney, Agent, or Firm* — McAndrews, Held & Malloy, Ltd.

(57) ABSTRACT

Methods and systems are provided for low-power decoding. An example system may include one or more storage circuits and a decoder circuit. The decoder circuit may implement a plurality of nodes for use during decoding, including at least one data generating node and at least one data checking node, and the storage circuits may store status information associated with the nodes, the status information indicating when each corresponding node is locked or unlocked. During decoding operations, the decoder circuit may set the status information to lock one or more of the nodes based on one or more locking conditions, and may cease decoding based on one or more ceasing conditions. The decoder circuit may locks a data generating node when a corresponding calculated value meets a particular condition, and may lock a data checking node when all data generating nodes associated with it are locked.

16 Claims, 4 Drawing Sheets

Related U.S. Application Data continuation of application No. 15/075,255, filed on Mar. 21, 2016, now Pat. No. 9,509,340, which is a continuation of application No. 14/156,733, filed on Jan. 16, 2014, now Pat. No. 9,294,129.

(60) Provisional application No. 61/753,170, filed on Jan. 16, 2013.

(52) U.S. Cl.
CPC .... H03M 13/1125 (2013.01); H03M 13/1128 (2013.01); H03M 13/1131 (2013.01); H03M 13/1137 (2013.01); H03M 13/1165 (2013.01); H03M 13/616 (2013.01); H03M 13/6505 (2013.01); H04L 1/0045 (2013.01)

(58) Field of Classification Search
CPC .......... H03M 13/1137; H03M 13/114; H03M 13/1165; H03M 13/6505; H03M 13/616; H04L 1/0045
USPC ................ 714/776, 758, 794, 752, 801, 804
See application file for complete search history.

(56) References Cited

U.S. PATENT DOCUMENTS

| | | |
|---|---|---|
| 2007/0283218 A1 | 12/2007 | Gopalakrishnan et al. |
| 2009/0172493 A1 | 7/2009 | Park et al. |
| 2010/0153811 A1 | 6/2010 | Kwon et al. |

OTHER PUBLICATIONS

Blad, A., Early-Decision Decoding of LDPC Codes, Linkoping Studies in Science and Technology, Thesis No. 1399, 2009, pp. 1-84.

Zimmermann, G., et al., Reduced Complexity LDPC Decoding Using Forced Convergence.

Blad et al., Early Decision Decoding Methods for Low-Density Parity-Check Codes, 2005, Swedish System-on-Chip Conference 2005, pp. 1-4.

Mansour, A Turbo-Decoding Message-Passing Algorithm for Sparse Parity-Check Matrix Codes, Nov. 2006, IEEE Transactiosn on Signal Processing, vol. 54, No. 11, pp. 4376-4392.

Casado et al., LDPC Decoders with Informed Dynamic Scheduling, 2010, IEEE, pp. 1-10.

LOW-POWER LOW DENSITY PARITY CHECK DECODING

CLAIM OF PRIORITY

This patent application is a continuation of U.S. patent application Ser. No. 15/358,473, filed on Nov. 22, 2016, which is a continuation of U.S. patent application Ser. No. 15/075,255, filed on Mar. 21, 2016, which is a continuation of U.S. patent application Ser. No. 14/156,733, now U.S. Pat. No. 9,294,129, filed on Jan. 16, 2014, which claims priority to U.S. Provisional Patent Application Ser. No. 61/753,170, filed on Jan. 16, 2013 and entitled "Low-Power Low Density Parity Check Decoding". Each of the above-referenced applications is hereby incorporated by reference in its entirety.

BACKGROUND OF THE INVENTION

Conventional systems and methods for low density parity check (LDPC) decoding can be overly power hungry. Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

Systems and methods for low-power low density parity check decoding, substantially as shown in and/or described in connection with at least one of the figures, as set forth more completely in the claims.

Advantages, aspects and novel features of the present disclosure, as well as details of various implementations thereof, will be more fully understood from the following description and drawings.

DETAILED DESCRIPTION OF THE INVENTION

As utilized herein the terms "circuits" and "circuitry" refer to physical electronic components (e.g. hardware) and any software and/or firmware ("code") which may configure the hardware, be executed by the hardware, and or otherwise be associated with the hardware. As used herein, for example, a particular processor and memory may comprise a first "circuit" when executing a first one or more lines of code and may comprise a second "circuit" when executing a second one or more lines of code. As utilized herein, "and/or" means any one or more of the items in the list joined by "and/or". As an example, "x and/or y" means any element of the three-element set {(x), (y), (x, y)}. As another example, "x, y, and/or z" means any element of the seven-element set {(x), (y), (z), (x, y), (x, z), (y, z), (x, y, z)}. As utilized herein, the term "exemplary" means serving as a non-limiting example, instance, or illustration. As utilized herein, the terms "e.g.," and "for example" set off lists of one or more non-limiting examples, instances, or illustrations. As utilized herein, circuitry is "operable" to perform a function whenever the circuitry comprises the necessary hardware and code (if any is necessary) to perform the function, regardless of whether performance of the function is disabled, or not enabled, by some user-configurable setting.

Figure 1:
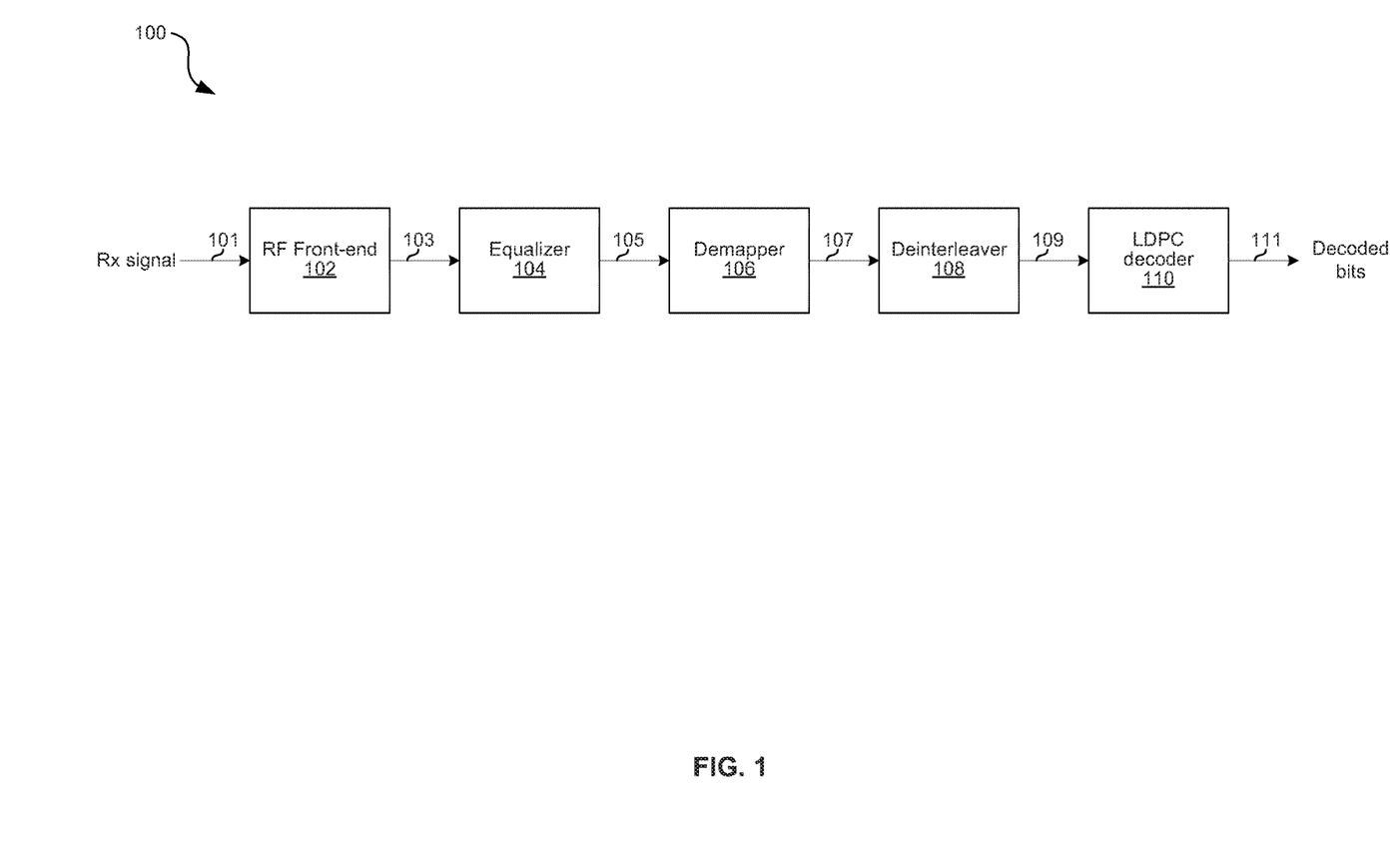
FIG. 1 is a simplified block diagram of an example receiver system comprising a low density parity check (LDPC) decoder.

Shown in FIG. 1 is a RF front-end circuit 102, an equalizer circuit 104, a demapper circuit 106, a deinterleaver circuit 108, and an LDPC decoder circuit 110.

The RF front-end 102 is operable to receive signal 101 via a wired, wireless, or optical channel and process the signal 101 to generate the signal 103. Such processing may include, for example, amplification, filtering, downconversion, and analog-to-digital conversion.

The equalizer 104 is operable to process the signal 103 to generate signal 105. Such processing may comprise, for example, interference cancellation, level adjustment, filtering, and/or the like. The signals 103 and 105 are, for example, digital signals which carry symbols (e.g., QAM symbols, BPSK symbols, etc.).

The demapper 106 is operable to process the signal 105 to demap each of the symbols of signal 105 to one or more bit values (or bit-value probabilities expressed as log-likelihood ratio(s), for example), and output the bit values or probabilities as signal 107. For example, the demapper 106 may map each N-QAM symbol of signal 105 to $\log_2(N)$ LLRs output as signal 107.

The deinterleaver 108 is operable to re-order the bits/LLRs of signal 107 to undo reordering performed in a transmitter from which the signal 101 was received.

The decoder 110 is operable to perform low density parity check decoding of the signal 109. The decoding may detect and correct errors in the signal 109 such that signal 111 contains fewer errors than the signal 109. Details of an example implementation of LDPC decoder 110 are described below with reference to FIGS. 2 through 4.

Figure 2:
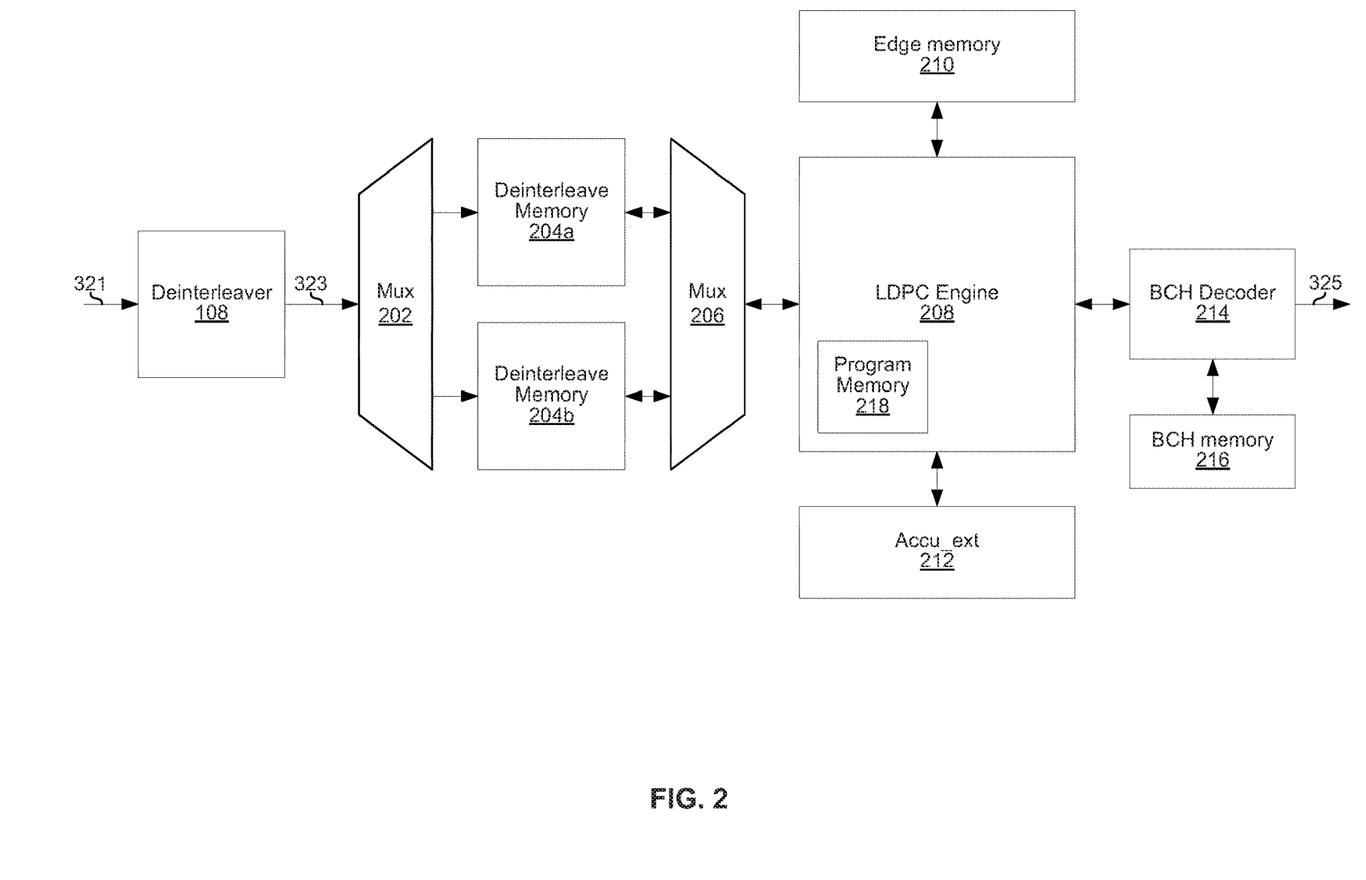
FIG. 2 depicts an example architecture for decoding using multiple types memory.

FIG. 2 depicts an example architecture for decoding using multiple types of memory. Shown is the deinterleaver 108, a multiplexer 202, deinterleaving memory arrays 204a and 204b, multiplexer/demultiplexer 206, LDPC engine 208, edge memory 210, accumulate and extension memory 212, Bose Chaudhuri Hocquenghem (BCH) decoder 214, and BCH memory 216.

The arrays 204a and 204b are used in ping pong fashion to buffer intrinsic messages (e.g., received symbols in binary form or as log-likelihood ratios) from the communication channel (received via deinterleaver 108). The edge memory 210 is used for storing extrinsic messages passed between check nodes and variable nodes of the LDPC engine 208. The accumulate extension memory 212 is used for storing sums generated after each sub-iteration of the LDPC engine 208.

Upon completion of LDPC decoding of a codeword, the output may be a BCH codeword which is passed to the BCH decoder 214. The BCH decoder 214 operates using memory 216 in performing BCH decoding. The BCH decoding may comprise: (1) calculating the syndromes for the BCH codeword; (2) determining the number of errors and the error locator polynomial from the calculated syndromes; (3) calculating the roots of the error location polynomial to find the locations of the errors in the BCH codeword; (4) calculating the error values at those error locations; and (5) correcting the errors.

Figure 3:
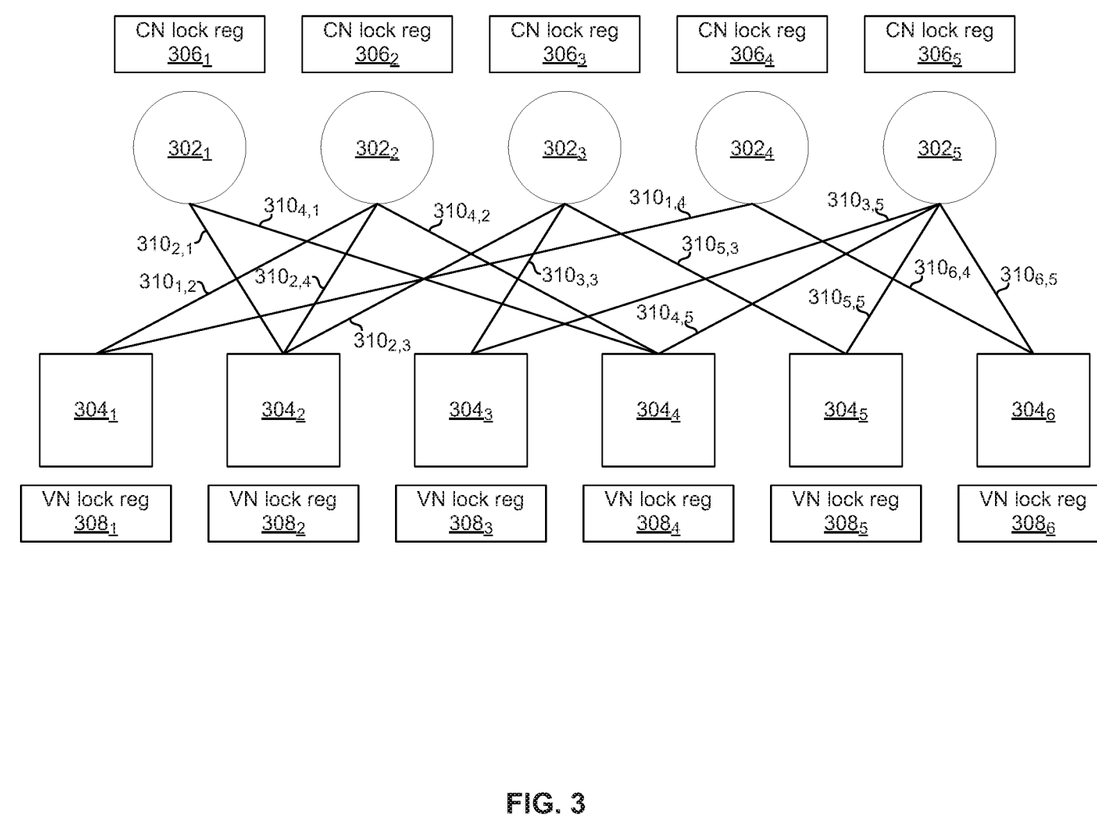
FIG. 3 depicts a tanner graph of an example low-power LDPC decoder.

FIG. 3 depicts a tanner graph of an example low-power LDPC decoder. In the example decoder shown, there are M check nodes 302 and N variable nodes 304. Any values of M and N are possible, with M=5 and N=6 being arbitrarily selected for purposes of illustration only. Similarly, the number and location of the edges 310 were selected arbitrarily for purposes of illustration only. Check node $302_1$ is connected to variable nodes $304_2$ and $304_4$; check node $302_2$ is connected to variable nodes $304_1$, $304_2$, and $304_4$; check node $302_3$ is connected to variable nodes $304_2$, $304_3$, and $304_5$; check node $302_4$ is connected to variable nodes $304_1$ and $304_6$; check node $302_5$ is connected to variable nodes $304_3$, $304_4$, $304_5$, $304_6$. During each iteration of LDPC decoding, each unlocked variable node 304 (the concept of a locked variable node is discussed below) may generate a variable-to-check message, and may send the variable-to-check message to its connected check node(s). The message may be a bit-value probability expressed, for example, as a log-likelihood ratio. The message may be sent by, for example, writing it to edge memory 210.

In accordance with an aspect of this disclosure, variable node $304_n$ (where n an integer between 1 and N) may be locked. When locked, variable node $304_n$ may refrain from generating variable-to-check messages, refrain from sending generated variable-to-check messages (e.g., refrain from updating a previous message written to edge memory 210), and/or may ignore/not retrieve messages from its connected check node(s) (e.g., refrain from reading a check-to-variable message previously written to edge memory 210). Thus, locking a variable node $304_n$ may save energy that would otherwise be expended calculating messages, writing messages to memory, and/or reading messages from memory. The energy savings may be particularly significant in instances where, for example, the variable node $304_n$ settles during iteration i (a relatively-small integer) but variable node $304_{n+1}$ requires x (a relatively-large integer) more iterations to settle. In such an instance, the calculations, sending of the messages, and retrieving of the messages by the variable node $304_n$ during iterations i+1 through i+x may be considered wasted energy.

Variable node $304_n$ may be locked once the magnitude of its bit-value probability (e.g., expressed as a log-likelihood ratio) is above a determined threshold $VT_n$. An unlocked variable node $304_n$ may continue to generate its bit-value probability based on messages from its connected check node(s) 302 until its bit-value probability exceeds a determined threshold for the variable node $304_n$, or until a timeout or maximum number of iterations is reached. A locked variable node $304_n$ may be unlocked upon, or prior to, beginning decoding of the next group of bits (e.g., next codeword or portion of current codeword). Whether variable node $304_n$ is locked may be indicated by its associated lock register $308_n$. The registers 308 may be, for example, part of edge memory 210 or accumulate and extension memory 212.

Each of the lock thresholds $VT_n$ may be dynamically determined in coordination with, or independent of, others of the lock thresholds $VT_n$. The dynamic determination may be on a per-iteration basis. The dynamic determination may be on a per-codeword basis. The dynamic determination may determine based on QoS requirements for the data being decoded (e.g., lower thresholds for audio, video, image data, and higher thresholds for packets headers and/or other critical bits of a packets stream). Higher values of $VT_n$ may be chosen for increased certainty at the expense of requiring more iterations and power consumption, and vice versa.

In accordance with an aspect of this disclosure, a check node $302m$ may generate check-to-variable messages only for those of its connected variable nodes 304 that are unlocked. That is, check node $302m$ may refrain from calculating check-to-variable messages for locked variable nodes 304, may refrain from sending check-to-variable messages for locked variable nodes 304, and/or may refrain from retrieving variable-to-check messages from locked variable nodes 304.

In accordance with an aspect of this disclosure, a check node $302_m$ (m an integer between 1 and M) may be locked. When locked, check node $302_m$ may refrain from generating check-to-variable messages, refrain from sending generated check-to-variable messages (e.g., refrain from updating a previous message written to edge memory 210), and/or may ignore/not retrieve messages from its connected variable node(s) (e.g., refrain from reading a variable-to-check message previously written to edge memory 210). Thus, locking a check node $304_m$ may save energy that would otherwise be expended calculating messages, writing messages to memory, and/or reading messages from memory. The energy savings may be particularly significant in instances where, for example, the check node $302_m$ settles during iteration i (a relatively-small integer) but variable node $304_{m+1}$ requires x (a relatively-large integer) more iterations to settle. In such an instance, the calculations, sending, and retrieving of the messages by the check node $302_m$ during iterations i+1 through i+x may be considered wasted energy.

Check node $302_m$ may be locked upon: (1) the probabilities of all of the variable nodes 304 connected to check node $302_m$ being locked; and (2) the parity constraint of check node $302_m$ has been met. In other words, when all of the variable nodes 304 connected to check node $302_m$ are determined with sufficient certainty and the modulo-2 sum of all the hard decisions of variables nodes connected to $302_m$ is zero (for even parity), check node $302_m$ may be locked while other unlocked check nodes continue to iterate until all of their respective variable nodes 304 are locked and/or until a timeout or maximum number of iterations is reached. Where different check nodes 302 are operated on sequentially (e.g., in a sequential, or partially-parallel LDPC decoder architecture), a locked check node 302 may be skipped. Unlocked check node $302_m$ may continue to retrieve variable-to-check messages from its unlocked variable node(s) 304, generate check-to-variable messages for its unlocked variable nodes 304, and send check-to-variable messages to its unlocked variable nodes 304 until all of its connected variable nodes 304 are locked, or until a timeout or maximum number of iterations is reached. A locked check node $302_m$ may be unlocked upon, or prior to, beginning decoding of the next codeword.

Whether check node $302_m$ is locked may be indicated by output of combinatorial logic which receives as input: (1) the settled hard-decision values (corresponding to the sign of the bit-value probabilities) of the variable nodes 304 connected to check node $302_m$; and the state of the lock register(s) 308 of the variable nodes 304 connected to check node $302_m$. The registers 308 may be, for example, part of edge memory 210 or accumulate and extension memory 212. In another example implementation, a lock status of check node $302_m$ may be stored in a lock register $306_m$. The register $306_m$ may be, for example, part of edge memory 210 or accumulate and extension memory 212.

Table 1 below shows the lock conditions for the variable nodes 304 and check nodes 302 of the example decoder shown in FIG. 3.

TABLE 1

| Node | Lock condition |
|---|---|
| $304_1$ | $P_{VN1} > VT_1$ |
| $304_2$ | $P_{VN2} > VT_2$ |
| $304_3$ | $P_{VN3} > VT_3$ |
| $304_4$ | $P_{VN4} > VT_4$ |
| $304_5$ | $P_{VN5} > VT_5$ |
| $304_6$ | $P_{VN6} > VT_6$ |
| $302_1$ | $(P_{VN2} > VT_2)$ & $(P_{VN4} > VT_4)$ & $(MOD(VN2+VN4,2)==0)$ |
| $302_2$ | $(P_{VN1} > VT_1)$ & $(P_{VN2} > VT_2)$ & $(P_{VN4} > VT_4)$ & $(MOD(VN1+VN2+VN4,2)==0)$ |
| $302_3$ | $(P_{VN2} > VT_2)$ & $(P_{VN3} > VT_3)$ & $(P_{VN5} > VT_5)$ & $(MOD(VN2+VN3\_VN5,2)==0)$ |
| $302_4$ | $(P_{VN1} > VT_1)$ & $(P_{VN6} > VT_6)$ & $(MOD(VN1+VN6,2)==0)$ |
| $302_5$ | $(P_{VN3} > VT_3)$ & $(P_{VN4} > VT_4)$ & $(P_{VN5} > VT_5)$ & $(P_{VN6} > VT_6)$ & $(MOD(VN3+VN4+VN5+VN6,2)==0)$ |

In instances that a check node is connected to only locked variable nodes, but does not pass parity check, remedial action may be taken to correct the situation. As an example, information from other check nodes may be used to determine which variable node has settled to an incorrect hard decision. As another example, additional iterations may be performed where, prior to such additional iterations, one or more of the locked variable nodes connected to the check node may be unlocked and a probability threshold for those variable nodes 304 may be increased.

Figure 4:
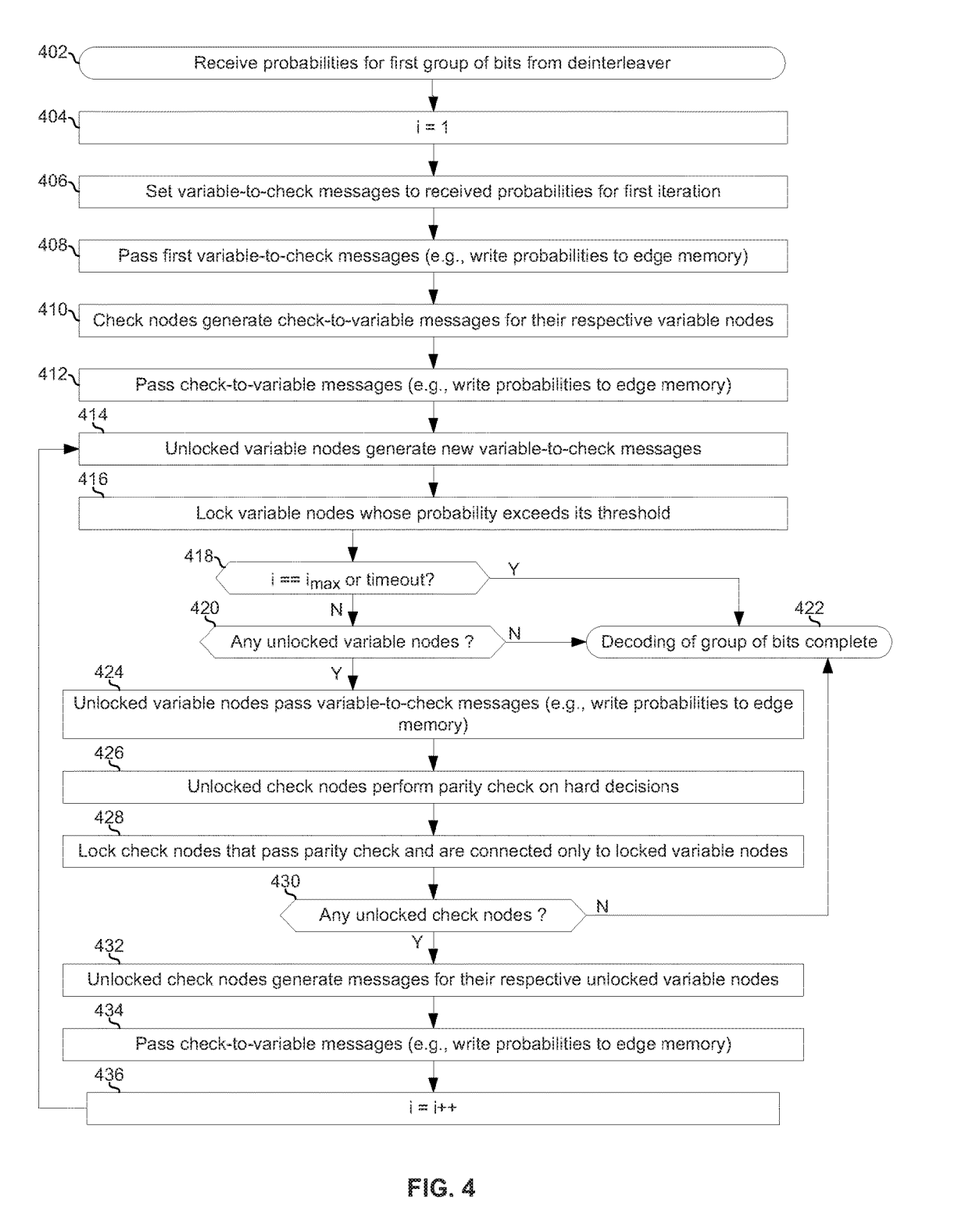
FIG. 4 is a flowchart illustrating an example process for low-power LDPC decoding, in accordance with example implementation of this disclosure.

FIG. 4 is a flowchart illustrating an example process for low-power LDPC decoding, in accordance with example implementation of this disclosure.

The process begins in block 402 when bit-value probabilities for a first group of bits are received from deinterleaver 108.

In block 404, a counter i is set to 1. In block 406, the respective variable-to-check messages of variable nodes 304 are set to the bit-value probabilities received from the deinterleaver 108.

In block 408, the variable-to-check messages are passed. This pass may comprise, for example, variable nodes 304 writing the bit-value probabilities received in block 406 to allocated memory cells in edge memory 210 and check nodes subsequently reading the messages from edge memory 210.

In block 410, the check nodes 302 generate check-to-variable messages for their respective connected variable nodes 304.

In block 412, the check-to-variable messages generated in block 410 are passed. This pass may comprise, for example, check nodes 302 writing the bit-value probabilities generated in block 410 to allocated memory cells in edge memory 210 and variable nodes 304 subsequently reading the messages from edge memory 210.

In block 414, unlocked variable nodes 304 generate new variable-to-check messages (e.g., their bit-value probabilities).

In block 416, any variable nodes $304_n$ whose probability generated in block 414 is/are greater than threshold $VT_n$ is/are locked.

In block 418, it is determined whether the maximum number of iterations or a timeout has been reached. If so, the process advances to block 422 and decoding of the group of bits is complete. If not, the process advances to block 420 in which it is determined whether any of the variable nodes remain unlocked. If not, the process advances to block 422 and decoding of the group of bits is complete. If so, the process advances to block 424.

In block 424, the unlocked variable nodes pass the variable-to-check messages generated in block 414.

In block 426, each unlocked check node determines whether the hard decisions of its connected variable nodes satisfy its parity constraint. This may include, for example, each check node calculating the modulo-2 sum of the hard decisions of its connected variable nodes and comparing the sum to zero (for even parity).

In block 428, any check node(s) whose parity constraint was satisfied in block 426 and that is/are connected to only locked variable nodes is/are locked.

In block 430 it is determined whether any of the check nodes remain unlocked. If not, the process proceeds to block 422. If so, the process proceeds to block 432.

In block 432, the unlocked check nodes 302 generate check-to-variable messages for their respective unlocked variable nodes.

In block 434, the check-to-variable messages generated in block 426 are passed. This pass may comprise, for example, check nodes 302 writing the bit-value probabilities generated in block 426 to allocated memory cells in edge memory 210 and variable nodes 304 subsequently reading the messages from edge memory 210.

In block 436 the counter i is incremented and the process then returns to block 414.

For the next group of bits, the locked variable nodes and/or check nodes may be unlocked and then the process may return to block 402.

In an example implementation of this disclosure, a message passing low density parity check (LDPC) decoder 110 may, during decoding of a first group of bits, lock a first variable node (e.g., $304_1$) upon a bit-value probability of the first variable node reaching a determined threshold, and lock a first check node upon all variable nodes connected to the first check node being locked and the check node's parity constraint being satisfied. For example, lock $302_1$ upon $304_2$ and $304_4$ being locked to "0" and "0", respectively, or being locked to "1" and "1", respectively (for even parity). The LDPC decoder may cease decoding the first group of bits upon all variable nodes of the LDPC decoder being locked, all check nodes of the LDPC decoder being locked, reaching a maximum number of iterations, or reaching a timeout. During a particular iteration of the decoding of the first group of bits in which the first variable node is locked, the LDPC decoder may refrain from generating a bit-value probability for the first variable node (e.g., if variable node $304_1$ is locked, refrain from generating a probability for variable node $304_1$), and/or refrain from passing messages from the first variable node to one or more check nodes connected to the first variable node (e.g., if variable node $304_1$ is locked, refrain from passing variable-to-check messages along $310_{1,2}$ and $310_{1,4}$). In a configuration where the first variable node is connected to the first check node, the LDPC decoder may, during a particular iteration of the decoding of the first group of bits in which the first variable node is locked, generate a check-to-variable message for the first check node and an unlocked variable node connected to the first check node, but refrain from generating a check-to-variable message for the first check node and the locked first variable node. As an example to illustrate, if the first check node is $302_1$, the first variable node is $304_2$, variable node $304_2$ is locked, and variable node $304_4$ is unlocked, then check node $302_1$ may generate and send a message to variable node $304_4$ during the particular iteration but not generate or send a message to $304_2$ during the particular iteration. During a particular iteration of the decoding of the first group of bits in which the first check node is locked, the LDPC decider may refrain from generating and/or passing check-to-variable messages for the first check node.

In an example implementation of this disclosure, a low density parity check (LDPC) decoder 110 characterized by a plurality of variable nodes (e.g., $304_1$ and $304_6$) connected to a check node (e.g., $302_4$) may perform one or more iterations of a message passing decoding algorithm to decode a particular group of bits. During each of the one or more iterations, any of the plurality of variable nodes having a bit-value probability below a respective determined threshold may generate and send a variable-to-check message to the check node, and any of the plurality of variable nodes having a bit-value probability above a respective determined threshold may not generate and send a variable-to-check message to the check node. For example, if $304_1$ is locked and $304_6$ is unlocked during a particular iteration, $304_1$ may not generate and send a message during the iteration but $304_6$ may generate and send a message during the iteration. During each of the one or more iterations, the check node may generate and send a check-to-variable message to each of the plurality of variable nodes having a probability below a respective determined threshold, and the check node may not generate and send a check-to-variable message to each of the plurality of variable nodes having a probability above a respective determined threshold. For example, if $304_1$ is locked and $304_6$ is unlocked during a particular iteration, $302_4$ may not generate and send a message to $304_1$ during the iteration but may generate and send a message to $304_6$ during the iteration.

Other embodiments of the invention may provide a non-transitory computer readable medium and/or storage medium, and/or a non-transitory machine readable medium and/or storage medium, having stored thereon, a machine code and/or a computer program having at least one code section executable by a machine and/or a computer, thereby causing the machine and/or computer to perform the methods described herein.

Accordingly, the present invention may be realized in hardware, software, or a combination of hardware and software. The present invention may be realized in a centralized fashion in at least one computing system, or in a distributed fashion where different elements are spread across several interconnected computing systems. Any kind of computing system or other apparatus adapted for carrying out the methods described herein is suited. A typical combination of hardware and software may be a general-purpose computing system with a program or other code that, when being loaded and executed, controls the computing system such that it carries out the methods described herein. Another typical implementation may comprise an application specific integrated circuit or chip.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A system comprising:
one or more storage circuits; and
a decoder circuit that implements a plurality of nodes for use during decoding, the plurality of nodes comprising at least one data generating node and at least one data checking node;
wherein:
the one or more storage circuits store status information associated with the plurality of nodes, the status information indicating when each corresponding node is locked or unlocked; and
the decoder circuit, during decoding of a group of bits:
sets the status information to lock one or more of the plurality of nodes based on one or more locking conditions; and
ceases decoding based on one or more ceasing conditions.

2. The system of claim 1, wherein the decoder circuit locks a data generating node when a particular calculated value, associated with the node and based on data being decoded, meets a particular condition.

3. The system of claim 2, wherein the decoder circuit locks the data generating node when a bit-value probability associated with the node reaches a determined threshold.

4. The system of claim 1, wherein the decoder circuit locks a data checking node when each of one or more data generating nodes associated with the data checking node is locked.

5. The system of claim 1, wherein the decoder circuit ceases decoding when all data checking nodes in the plurality of nodes are locked, all data checking nodes in the plurality of nodes are locked, a maximum number of decoding iterations is reached, or a timeout occurs.

6. The system of claim 1, wherein the decoder circuit, during a particular decoding iteration, refrains from generating data for each locked data generating node.

7. The system of claim 1, wherein the decoder circuit, during a particular decoding iteration, refrains from passing data from each locked data generating node to any data checking node connected to the locked data generating node.

8. The system of claim 1, wherein the one or more storage circuits comprise one or more registers for storing the status information.

9. The system of claim 8, wherein the one or more registers comprise at least one data checking node lock register configured to indicate that the at least one data checking node is locked or unlocked.

10. The system of claim 8, wherein the one or more registers comprise at least one data generating node lock register configured to indicate that the at least one data generating node is locked or unlocked.

11. The system of claim 1, wherein the decoder circuit, during a particular decoding iteration in which a first data generating node, connected to a first data checking node, is locked:

generates decoding related messages between the first data checking node and an unlocked data generating node connected to the first data checking node; and refrains from generating decoding related messages between the first data checking node and the first data generating node.

12. The system of claim 1, wherein the decoder circuit, during a particular decoding iteration in which a first data generating node, connected to a first data checking node, is locked:

passes decoding related messages between the first data checking node and an unlocked data generating node connected to the first data checking node; and refrains from passing decoding related messages between the first data checking node and the first data generating node.

13. The system of claim 1, wherein the decoder circuit, during a particular decoding iteration of the decoding of the group of bits in which a first data checking node is locked, refrains from generating decoding related messages between the first data checking node.

14. The system of claim 1, wherein the decoder circuit, during a particular decoding iteration of the decoding of the group of bits in which a first data checking node is locked, refrains from passing decoding related messages from the first data checking node to its connected data generating nodes.

15. The system of claim 1, wherein the decoder circuit unlocks any locked node in the plurality of nodes prior to beginning decoding of a new group of bits.

16. The system of claim 1, wherein the decoder circuit when locking a data checking node, locks to the same value for all data generation nodes connected to the first data checking node.

* * * * *